United States Patent [19]
Barzely

[11] 3,986,055
[45] Oct. 12, 1976

[54] VOLTAGE-FREQUENCY AND FREQUENCY-VOLTAGE RECIPROCAL CONVERTER

[75] Inventor: Avner Barzely, Givat Shmuel, Israel

[73] Assignee: I. Jordan Kunik, New York, N.Y.; a part interest

[22] Filed: Feb. 17, 1976

[21] Appl. No.: 658,339

Related U.S. Application Data

[63] Continuation of Ser. No. 386,965, Aug. 9, 1973, abandoned.

[52] U.S. Cl. ............................ 307/271; 307/261; 307/235 R; 328/140; 328/150; 307/233 R
[51] Int. Cl.² ..................... H03K 1/16; H03K 5/20; H03B 3/04
[58] Field of Search .......... 307/233, 260, 261, 271, 307/235 R; 328/140, 150; 324/120; 340/347 C

[56] References Cited
UNITED STATES PATENTS

| | | |
|---|---|---|
| 2,817,704 | 12/1957 | Huntley............................ 340/347 C |
| 3,216,002 | 11/1965 | Hoffman ........................ 340/347 C |
| 3,419,784 | 12/1968 | Winn ...................................... 321/8 |
| 3,482,116 | 12/1969 | James .................................. 307/261 |
| 3,555,441 | 1/1971 | Axford ................................ 307/233 |
| 3,560,864 | 2/1971 | Nihof .................................. 328/127 |

*Primary Examiner*—Stanley D. Miller, Jr.
*Attorney, Agent, or Firm*—I. Jordan Kunik

[57] ABSTRACT

A novel electronic transceiver that alternatively performs either as a voltage-to-frequency (V/F) converter or as a frequency-to-voltage (F/V) converter. The transceiver can selectively be operated in either of the two modes by appropriate terminal connections which cause the transceiver to perform in the particular mode desired or necessary. The transceiver includes an analog integrator, a voltage follower, and a charge transfer circuit interconnected and having selectable terminals for external connections whereby the circuit performs selectively in either the V/F mode or the F/V mode.

9 Claims, 3 Drawing Figures

VOLTAGE-FREQUENCY AND FREQUENCY-VOLTAGE RECIPROCAL CONVERTER

This is a continuation of application Ser. No. 386,965 filed Aug. 9, 1973, now abandoned.

FIELD OF THE INVENTION

This invention relates to voltage-to-frequency and frequency-to-voltage conversion and, more particularly, to a new combination of two reciprocal electronic circuits: the first circuit performs the function of voltage-to-frequency conversion (V/F), and the second circuit performs the function of frequency-to-voltage conversion (F/V). The novelty of these two circuits is that both utilize exactly the same active component blocks. The construction of these active blocks into one small package (monolithic or hybrid) will result in a versatile integrated circuit (I.C.) module which can be efficiently operated selectively in either a V/F or F/V mode without idling any of these active blocks. Two such identical I.C. modules can form a compatible transmitter-receiver pair for a variety of applications. The foregoing modes of operation of the I.C. can be established by suitable incorporation of a few external components. Since the transceiver can be operated in the V/F mode (transmit) or in the F/V mode (receive), it is designated herein as a V/F Transceiver, or VFT. The VFT herein may be incorporated into an I.C. which contains all the active elements or blocks needed to form a voltage-to-frequency converter or a frequency-to-voltage converter.

There are many applications in which there is a need for conversion between frequency and voltage, involving any one of the following types of conversion:
 a. Voltage-to-Frequency
 b. Frequency-to-Voltage
 c. Voltage-to-Frequency AND Frequency-to-Voltage.

Some applications for Voltage-to-Frequency conversion are:
 Telemetry
 Integration of sensor's output (totalizer)
 Analog-to-digital conversion
 Phase lock loops
 Voltage controlled oscillators (VCO)
 Digital voltmeter (DVM)
 Digital Panel Meter (DPM) with floating terminals
 Control
 Isolation.

Some applications for Frequency-to-Voltage conversion are:
 Tachometry
 Frequency monitoring
 Telemetry
 Control.

Some applications which involve combined V/F and F/V conversion are:
 Transmission of analog data
 Recording and playback of analog data
 Isolation
 Telemetry
 Frequency-to-frequency converter (scale factor).

DESCRIPTION OF THE PRIOR ART

Prior art V/F and F/V converter circuits do not use identical active blocks. Therefore, a prior art V/F cannot be changed to a prior art F/V merely by changing the order of the internal active blocks because a prior art F/V converter might require some other active parts which are not used in the V/F converter. The same will be true for the inverse case, that is, a prior art F/V converter cannot be changed to a prior art V/F converter merely by changing the order of the internal active blocks.

An attempt to combine two prior art V/F and F/V converters into one I.C. package will result at least in a few idled and, therefore, wasted active blocks in each of the two modes of operation. In the present invention, however, all of the internal active blocks are essential for proper operation, regardless of mode of operation and there is no waste in one or more idled active blocks.

For example, let it be assumed that a prior art V/F converter uses three blocks: A, B and C; and that a prior art F/V converter uses three blocks: A, D and E. The block common to both circuits is obviously A, so that if both circuits are combined into one I.C. package, the I.C. will consist of blocks A, B, C, D and E. An attempt to operate this I.C. in the V/F mode will result in the idling of blocks D and E, while an attempt to operate this I.C. in the F/V mode will result in the idling of blocks B and E.

The system of the present invention uses, for example, blocks X, Y and Z for V/F mode, and the same blocks X, Y and Z for the F/V mode, wherein all of the blocks are functional in either mode and none of them is idled regardless at what mode the system is operating.

Amongst the advantages of the present invention over the prior art are:

1. The V/F Transceiver herein can be operated in either mode: V-to-F conversion or F-to-V conversion. It provides a complete circuit requiring no further design work. The device herein is very simple to apply and requires no previous experience in the field of V-to-F or F-to-V conversion in order to incorporate it in a system which requires a conversion between voltage and frequency. In the form of an I.C. the novel circuit herein can serve as a standard design block which simplifies system design.

2. Superior and uncompromised performance. The circuit design of the VFT herein, in both of its modes of operation, achieves an ultimate in performance without the usual drawbacks resulting from tradeoffs between cost and performance encountered in prior art low cost models of single mode modules. The performance of the VFT herein in either of its two modes surpasses the performance of high cost prior art devices. With appropriately selected components, the VFT herein can perform reciprocally with maximum linearity error in the order of 0.005 percent of full scale, to full scale frequency of 100 kHz.

3. Ultra miniature size and extremely low price. In each mode of operation (V/F or F/V), the circuit design fully utilizes state of the art integrated circuit technology whereby cost savings as well as miniaturization are both realized to an appreciable extent.

4. The output of the VFT herein, when operated in the V/F mode, is directly compatible with the input of another VFT of the same type, which is operated in the F/V mode, thereby providing a compatible transmitter-receiver pair. Interface problems are obviated and no additional signal conditioning circuit is needed. Two VFT units of the same type in tandem array provide a complete V-to-F and F-to-V system.

5. Good also for general application which requires the use of the three uncommitted active blocks.

6. Simple inventory handling. One item for two different applications.

These and other novel features and advantages of the present invention will be described and defined in the following specification and claims.

BRIEF DESCRIPTION OF THE DRAWINGS

The active component blocks in the circuits of both FIGS. 2 and 3, are:

Figure 1:
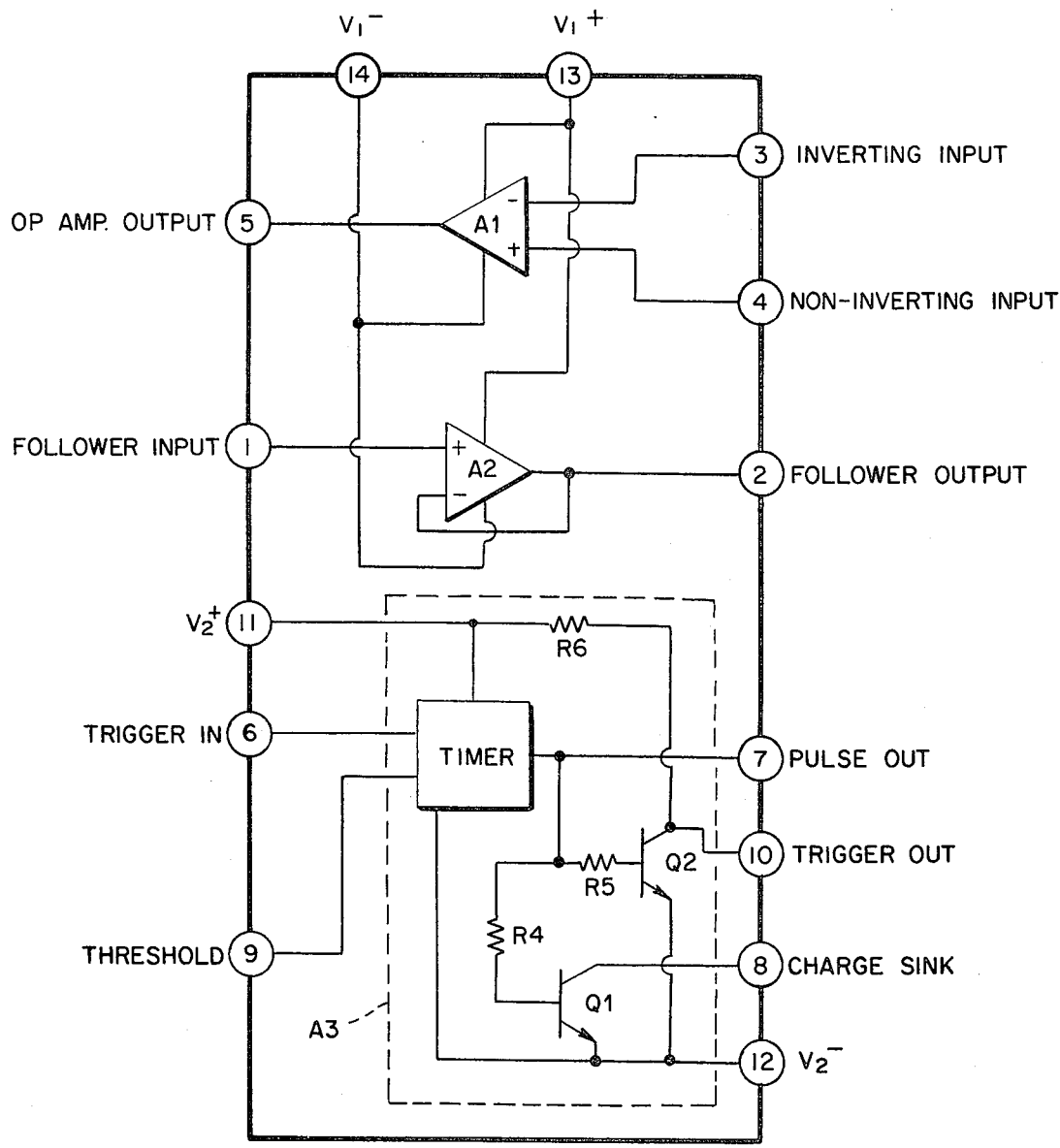
FIG. 1 is a schematic circuit diagram of the basic transceiver (VFT) module of the present invention.

a. Analog integrator block comprising operational amplifier A1 which is an ordinary op amp, with suitable parameters for operating as a Miller Integrator. The analog integrator (A1) includes associated resistor R1 and capacitor C1 whose functions will be described hereinafter.

b. Voltage follower block comprising operational amplifier A2 which operates as a classical voltage follower.

c. Charge transfer block comprising a timer, transistors Q1 and Q2, and resistors R4, R5, and R6.

The function of the charge transfer block in general is to remove or extract a discrete and constant charge quotient from capacitor C1 whenever the "trigger in" terminal 6 is being triggered. This is accomplished as follows: With the presence of a triggering signal at terminal 6, the timer produces a constant duration pulse which is used to saturate transistor Q1. The resulting current $I_2$ through transistor Q1 and resistor R2 is constant due to the fact that the emitter of Q1 (terminal 12) is maintained at a constant potential with respect to the summing junction of A1 (terminal 3) from which the collector current of Q1 is drawn. Current $I_2$ will discharge capacitor C1. Since the duration of $I_2$ is constant, the net amount of charge that will be removed or extracted from capacitor C1 once every cycle will be equal to $$I_2 = (\text{duration of } I_2)$$

The analog — or Miller — integrator block contains an ordinary operational amplifier A1 which has two input terminals 3 and 4, and one output terminal 5. Operational amplifier A1 receives its power from terminals 13 and 14, also identified respectively as $V_1^+$ and $V_1^-$. Terminal 13 is normally connected, for example, to a +15 volt supply and termfnal 14 is connected to a −15 volt supply. Other types of operational amplifiers may require somewhat different supply voltages.

The voltage follower block also contains an ordinary operational amplifier A2. In this block, however, the inverting input marked with the negative (−) sign is connected internally to the output of said operational amplifier A2 so that only the non-inverting input, marked with a positive (+) sign is available externally to the voltage follower block at terminal 1 and identified as "follower input." The output of the follower block is available at terminal 2 which is identified as "follower out." Op amp A2 receives its positive and negative supply voltages through terminals 13 ($V_1^+$) and 14 ($V_1^-$).

The charge transfer block A3 contains an ordinary timer such as, for example, a Type 555 timer produced currently by Signetics Corp. Included in the charge transfer block are transistors Q1 and Q2 connected to the output of the timer through base resistors R4 and R5, respectively. R6 is the collector resistor of Q2. The collector of Q2 is available for external connection at terminal 10 and the uncommitted collector of Q1 is available for external connection at terminal 8. The functions of transistors Q1 and Q2 will be described hereinafter in the contexts of V/F and F/V operation.

The timer is triggered from an external signal through terminal 6. The output of the timer is available at terminal 7 marked "pulse out" where the output waveform constitutes a pulse.

Terminal 9, identified at "threshold" serves the function of connecting an external resistor-capacitor circuit to the timer, the value of said resistor and capacitor determining the width or duration of the output pulse obtained at the pulse out terminal 7.

The voltage supply for the charge transfer block, including the timer, is provided from terminals 11 ($V_2^+$) and 12 ($V_2^-$). Terminal 12, identified with the legend $V_2^-$ is connected, for example, to the negative terminal of a −6.4 volt supply which must be of reference quality, that is, very stable. As for the other two supplies, namely, at terminals 13 and 14, their voltages do not necessarily have to be as stable as that applied to terminal 12. To complete the circuit for supply to the charge transfer block, the positive terminal of said −6.4v supply is connected to terminal 11, identified as $V_2^+$.

Figure 2:
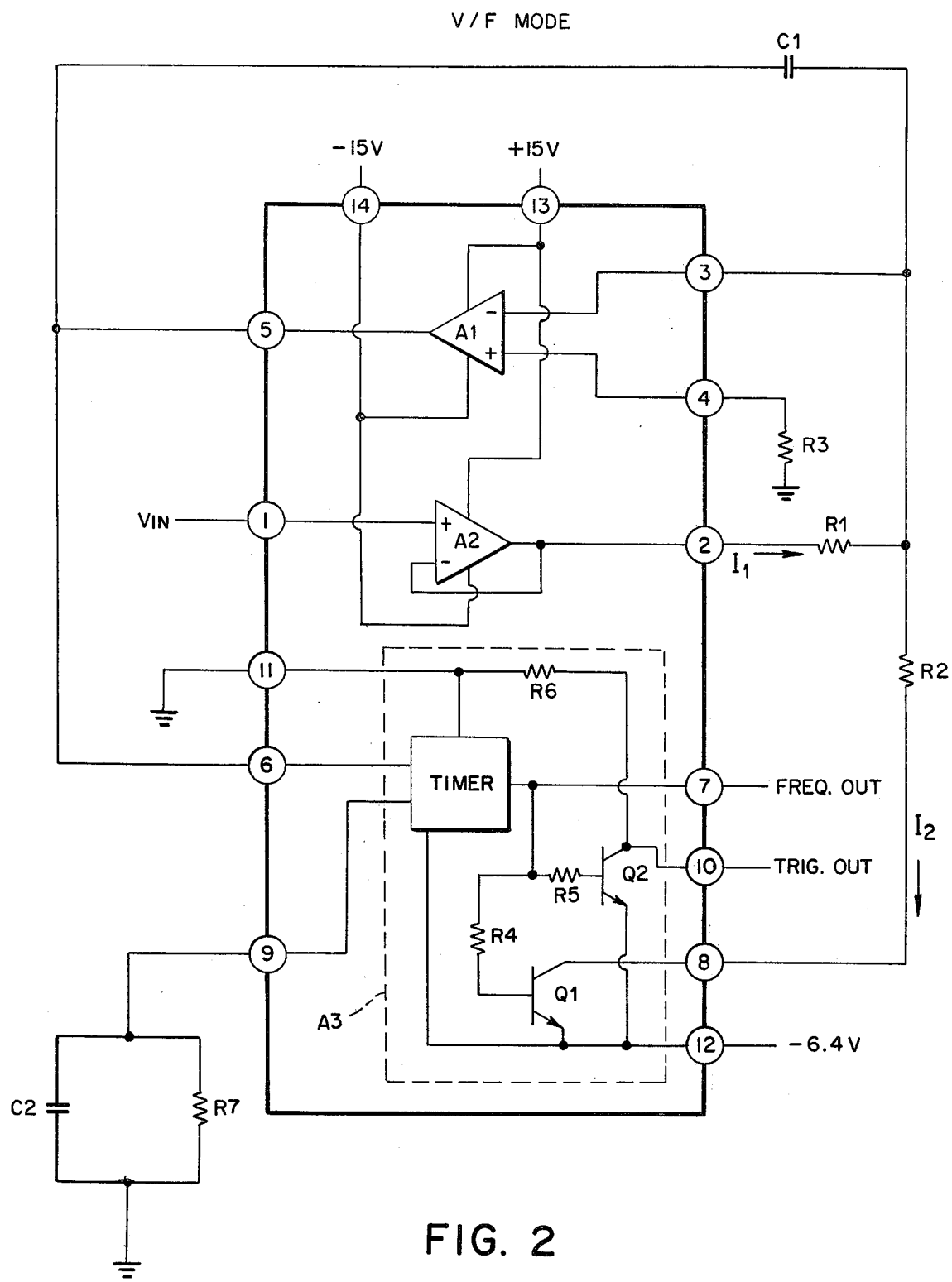
FIG. 2 is a schematic circuit diagram of the transceiver (VFT) operating in the voltage-to-frequency mode.

In FIG. 2, terminal 7, designated pulse out, is the output of the converter operating in the V-to-F mode. Terminal 7 is connectable to the user's apparatus depending upon the particular application to which the module herein is to be put, as described hereinbefore.

In FIG. 2, the input voltage (V in) is connected to terminal 1, designated as follower input. The source of the voltage input would depend upon the user's application.

Figure 3:
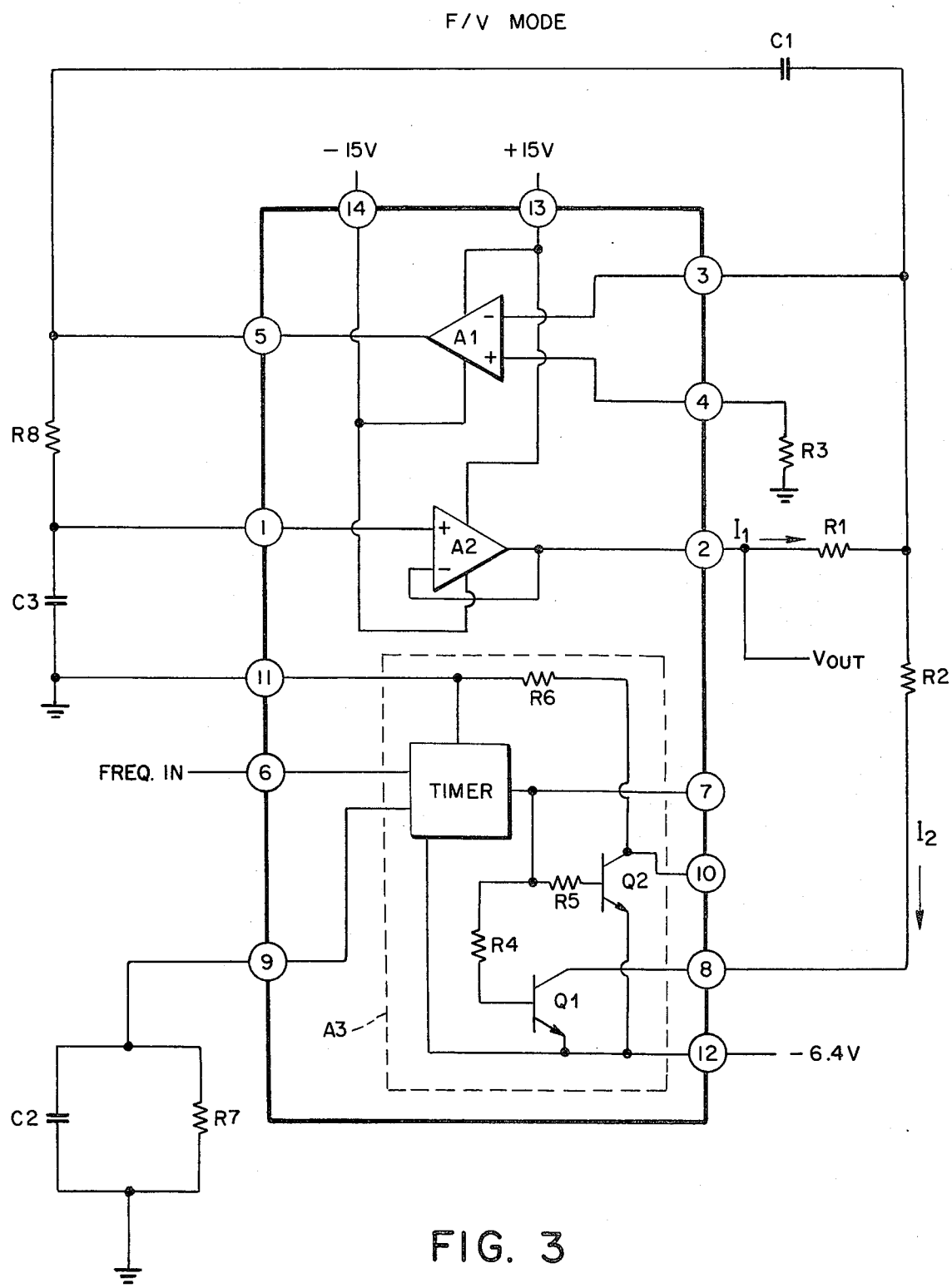
FIG. 3 is a schematic circuit diagram of the transceiver (VFT) operating in the frequency-to-voltage mode.

As to the F/V mode illustrated in FIG. 3, the configuration of the component blocks and their terminals are essentially the same as in FIG. 2 except for the following:

The input to the F/V module is connected to terminal 6 in the form of an input frequency that is obtained from the desired source depending upon the user's application. The output (V out) of this module is a DC signal which is available at terminal 2, designated follower output. The apparatus to which terminal 2 is connected depends upon the user's application.

In the F/V mode (FIG. 3) terminals 7 and 10 are not connected to any other apparatus.

The timer is operated as a mono-stable device and it is assumed to have the following terminal (or black box) characteristics: Triggering level: ⅔ $V_2^-$(−4v with $V_2^- = -6v$) where $V_2^-$ is the voltage of the negative supply connected to terminal 12.

Triggering sense: The timer will be triggered whenever the voltage of the "trigger in" terminal 6 crosses the triggering level in the negative direction.

Output at the pulse out terminal of the timer: Normally, the pulse out terminal is maintained at a voltage equal to $V_2^-$ ($V_2^-$ is the negative supply voltage to the timer). At the instant that the timer is being triggered, the output will switch to a voltage equal to $V_2^+$ for a constant duration T. ($V_2^+$ is the positive supply voltage to the timer). At the end of elapsed time T, the output will switch back to a voltage of $V_2^-$, and it will remain at $V_2^-$ potential for as long as the timer is not re-triggered. During the time designated as T, the timer is said to be in the "on" state. At all other times, said timer is said to be in the "off" state. Essentially, the on time T, which is generated by the timer in conjunction with resistor R7 and capacitor C2, is solely a function of said timing elements. Since R7 and C2 are constants, the on time T is also constant. The manner in which the timer achieves its characteristics is well known to those who are skilled in the art and, therefore, the internal functional structure of A3 in conjunction with the external timing elements R7 and C2 need not be discussed here.

Functional description of the VFT working in the Voltage-to-Frequency conversion mode Referring to Fig. 2, the three active blocks are interconnected as shown, with signal propagation being represented as follows:

$$V\ in \rightarrow A2 \rightarrow A1 \rightarrow A3 \rightarrow F\ out$$

The input stage to the voltage-to-frequency converter is voltage follower A2. Using a follower at the input ensures an extremely high input impedance, a feature that is highly desirable in order to eliminate any possibility of loading the voltage source by the input circuit of the converter.

A positive input voltage at the input terminal 1 will propagate through the voltage follower A2 to terminal 2 and will be developed across resistor R1, which is the input resistor, to analog integrator A1. The non-inverting input of integrator A1 is connected through terminal 4 and resistor R3 to common in a manner familiar to those skilled in the art.

The resulting current $I_1$ through R1 will flow into summing junction, terminal 3, and will charge up capacitor C1 of analog integrator A1 at a constant rate, causing integrator A1 to generate at its output terminal 5 a negative going ramp with a slope:

$$-\frac{Vin}{R1\ C1}$$

The output of integrator A1 is connected to trigger in terminal 6 of the timer and, therefore, when the negative going ramp at the output of integrator A1 crosses the triggering level of said timer, the latter will produce a constant duration positive pulse at its output terminal 7 in a manner explained earlier. During the on time of the timer, transistor Q1 will be driven to saturation through its base resistor R4.

While transistor Q1 is in saturation, a current $I_2$ which is equal to $$\frac{(Vref - Vce\ sat)}{R2}$$

will flow through resistor R2 into charge sink terminal 8. In this equation, "V ref" is the reference voltage connected to terminal 12. This same reference voltage constitutes the negative supply voltage for the charge transfer block. "Vce sat" is the collector-emitter voltage of transistor Q1 during saturation conditions.

Since Vce sat in the above expression is much smaller than V ref it will be neglected in the following derivation. It will be noted that a proper selection of saturation conditions of transistor Q1 will make Vce sat independent of temperature changes.

The slope of the ramp at the output of A1 during the on time of the timer will then be equal to $$\frac{Vref}{R2\ C1} - \frac{Vin}{R1\ C1}$$

The first term in this expression is the larger one, and therefore the slope will be a positive going one.

At the end of the on time T, the output of A1 will be far enough above the triggering level of the timer, and at the end of the on time T, the output of the timer will return to the low state, cutting off transistor Q1. The current $I_2$ will drop to zero and the next cycle will begin as the output of integrator A1 starts to generate another negative going ramp.

The rate at which this cycle repeats itself is directly proportional to the input voltage. From the key relation $I_1 = I_2$ average, it can be shown that the relation between input voltage and output frequency is:

$$f_o = \frac{11\ Vin\ R2}{Vref\ R1\ T} \qquad \text{Eq. (1)}$$

where T is the on duration of the timer.

As mentioned earlier, T is a function of timing elements resistor R7 and capacitor C2. These two elements are connected to the timer through terminal 9. The relation between these elements is:

$$T = K\ R7\ C2 \qquad \text{Eq. (2)}$$

where K is a constant which depends upon the physical structure of the timer. Therefore, when combining equations (1) and (2), we find that the output frequency as a function of the input voltage is:

$$f_o = \frac{R2}{K\ Vref\ R1\ R7\ C2} Vin \qquad \text{Eq. (3)}$$

The output frequency is available at the pulse out terminal 7. Inverter transistor Q2, together with its base resistor R5 and collector resistor R6 are added to the circuit in order to provide a negative trigger pulse which is available at the trigger out terminal 10. The output pulse from said terminal 10 is useful in those applications where a VFT working in the F-to-V mode has to be triggered by another VFT working in the V-to-F mode. In such case, the trigger out terminal 10 of the V-to-F unit is connected to the trigger in terminal 6 of the F-to-V unit. The output trigger pulse from the trigger out terminal 10 is directly compatible with the input of another VFT which is operated in the frequency-to-voltage conversion mode.

Whenever a VFT working in the V-to-F mode has to drive another VFT working in the F-to-V mode, care must be taken to ensure that the on time of the V/F circuit will be slightly shorter than that of the F/V circuit. Otherwise, the F/V circuit might be double-triggered and it will not work properly. An alternate way to prevent double triggering in the F/V converter is to differentiate the input pulse. This can be done, for example, by placing a capacitor in series with the trigger in terminal 6 of the F/V circuit. In addition, a resistor of a proper value is connected between the trigger in terminal 6 and common. Unlike some prior art V/F converters, the response of the VFT in the V-to-F mode is instantaneous.

Functional description of the VFT working in the Frequency-to-Voltage conversion mode Referring to FIG. 3, the three active blocks are interconnected as shown, with the signal propagation being represented as follows:

$$F \text{ in} \rightarrow A3 \rightarrow A1 \rightarrow A2 \rightarrow V \text{ out}$$

Since the functions of each of the active blocks were explained in detail in the V/F mode, the functional description of the VFT working in the F/V mode will be more general.

The input stage to the VFT in the F/V mode is the charge transfer block. In the presence of an input frequency signal at the trigger in terminal 6, the mono-stable timer will produce its constant duration output pulses. Each pulse will saturate Q1 through base resistor R4 resulting in the pulsed current $I_2$ which will flow from the summing junction of A1, terminal 3, through R2 and terminal 8 into the collector of Q1. See arrows for the direction of $I_1$ and $I_2$. Since the relation (current) $I_2$ average = (current) $I_1$ must hold, the closed feedback loop comprising the output of A1 through R8, to terminal 1, through follower A2 to terminal 2 and through R1 back to the summing junction of A1, must adjust $I_1$ to be equal to the input current $I_2$ average.

Essentially, $I_2$ is proportional to the input frequency. Also $I_1$ is proportional to V out (voltage out) because V out produces current $I_1$. Therefore, the condition $I_1 = I_2$ average implies that the output voltage is directly proportional to the input frequency.

The explanation of the F/V conversion thus far, although generally correct from a functional point of view, is not valid during transient conditions. Such transients will occur whenever the input frequency is changing. It can be shown that the equation which describes the input-output relationship at all times is the following second order differential equation:

$$R8 \ C1 \ C3 \ \frac{d^2 V_o(t)}{dt^2} + C1 \ \frac{dV_o(t)}{dt} + \frac{V_o(t)}{R1} = \frac{K \ Vref \ R7 \ C2}{R2} f_{in(t)} \qquad \text{Eq. (4)}$$

From this relation, it becomes apparent that when $f_{in}$ is constant, then the output voltage Vo is:

$$V_O = \frac{K \ Vref \ R1 \ R7 \ C2}{R2} f_{in} \qquad \text{Eq. (5)}$$

A point of special interest is the step response of the circuit. From equation (4) it can be shown that the circuit will be critically damped when:

$$R1 \ C1 = 4 \ R8 \ C3 \qquad \text{Eq. (6)}$$

When the condition:

$$R1 \ C1 < 4 \ R8 \ C3 \qquad \text{Eq. (6a)}$$

exists, the circuit will be underdamped and with:

$$R1 \ C1 > 4 \ R8 \ C3 \qquad \text{Eq. (6b)}$$

the circuit will be overdamped.

It is important to note that the values of C1, R8 and C3 do not affect the full scale setting of the converter because these three elements do not participate in equation (5). Therefore, there is full freedom to select C1, R8 and C3 in such a way that an optimal output ripple/output response time relation can be established according to equations (6) (6a) or (6b).

Output ripple and output response time are usually contradictory parameters in F/V converters. In some applications, fast response is more important. In other applications, ripple-free output is more important. Therefore, the freedom to select the desired ripple/response relation constitutes an advantage, whereby it is possible to operate the converter in the optimal condition for a given application.

Response and Ripple in an F-to-V converter

Ideally, a frequency-to-voltage converter should have an instantaneous response and zero output ripple. However, in actual practice, fast response and low output ripple in an accurate F/V converter are usually two contradictory parameters. If a smooth output is the prime objective, response time must be sacrificed, and vice versa. If a fast response is important, a relatively large output ripple must be tolerated.

One of the main advantages of the circuit of the F/V shown in FIG. 3 over prior art F/V converters is that the tradeoff between response time and output ripple is minimized by R8 and C3, whereby an increase in the time constant R8 C3 will decrease the output ripple and improve the response time simultaneously.

The decrease in output ripple as a result of increase in time constant R8 C3 can be readily understood because these two components form a low pass filter. According to the assertion that an increase in time constant R8 C3 will improve the response time, this claim is substantiated by equations (6), (6a) and (6b) above. These three equations suggest that an increase in the time constant R8 C3 will alter the response of the circuit from slow or overdamped (equation 6b) to fast or underdamped (equation 6a). Thus, an increase in the time constant R8 C3 will indeed improve both output ripple and response time.

The limit to how much this time constant can be increased is the point where the circuit will break into undesired oscillations. In actual practice, the values of R8 and C3 should be selected so that the overshooting will only be as much as is tolerable for the specific given application. Such selection will automatically ensure that the output ripple will be at its minimum.

The advantages of the VFT in the F/V mode (FIG. 3) over prior art frequency-to-voltage converters are:
a. Better linearity
b. Faster response
c. Lower ripple
d. Wider dynamic range The total number of external components used are: six in the V-to-F mode, and eight in the F-to-V mode. Additionally, an external voltage reference source is needed in both modes and is applied to terminal 12 in FIGS. 2 and 3.

The function of R3 connected to terminal 4 in either mode of operation is to minimize the undesirable effects of the bias current of op amp A1. The resistance value of R3 should be equal to that of R1 connected to terminal 2. When a high degree of accuracy is required, it is important to adjust the offset voltage of A1, as follows:

a. In the V/F mode: With the follower in input connected to common, the voltage offset of A1 should be adjusted to zero output frequency, while observing with an oscilloscope the ramp at the output of A1 at terminal 5.

b. In the F/V mode: With trigger in terminal left open (no input frequency) the voltage offset of A1 should be adjusted to zero output voltage as measured in follower out at terminal 2.

The voltage offset of A1 can be adjusted either by an external bipolar divider across R3, or by using an op am (at A1) which has internal offset adjustment, for example, such as type 741 op amp. Both arrangements are not shown in the Figures.

In many applications, it is required that a VFT in the V/F mode is to be followed by another VFT working in the F/V mode. For example, one such application is isolation. A unique advantage of the VFT herein in such application is that when using identical components in both V/F and F/V circuits, the Temperature Coefficient (TC) of the system will be virtually zero if both circuits are maintained at the same temperature.

To substantiate this, reference is made to equations (3) and (5) above. In the particular application mentioned above, $f_{in}$ of equation (5) is identical to $f_o$ of equation (3). Let this frequency be called $f$. The input to the system is Vin of equation (3) and the output of the system is Vo of equation (5). To solve for the relation $$\frac{Vo}{Vin},$$

we first solve equation (3) for Vin and obtain:

$$Vin = \frac{f\ K\ Vref\ R1\ R7\ C2}{R2} \qquad \text{Eq. (3a)}$$

Now, we divide equation (5) by equation (3a) and get:

$$\frac{Vo}{Vin} = 1 \qquad \text{Eq. (7)}$$

Thus, the system will have a transfer function of unity. The significance of this is that the performance of the system is essentially independent of drift in the physical values of the circuit components. Such drift might occur, for example, when the system is subjected to changing environmental conditions.

As indicated hereinbefore, the basic VFT comprising blocks A1, A2 and A3, is operative selectively in either the V/F mode or the F/V mode by the connection of associated external parts and instruments to appropriate terminals. Suitable resistors and capacitors are connected to the VFT in both modes of operation with an additional resistor capacitor circuit added for operating the F/V mode.

In one typical example of operation in the V/F mode (FIG. 2), the circuit was constructed with the following discrete components where k represents 1000 ohms and the percentage figure indicates the plus or minus tolerance:

R1 = 47k, 2 percent
R2 = 20k, 2 percent
R3 = 47k, 10 percent
R4 = 56k, 10 percent
R5 = 56k, 10 percent
R6 = 3.3k, 10 percent
R7 = 10k, 2 percent
C1 = 0.01 microfarads (polystyrene)
C2 = 1000 picofarads (polystyrene)

A1 and A2 are op amp such as Type 5558 (Signetics) and the timer is Type 555 (Signetics). Transistors Q1 and Q2 are NPN transistors such as Type 2N3904 (Fairchild).

With this configuration and values, the input range to the V/F converter is 0 to 10 volts, and the output range of the converter is zero to approximately 50kHz. In repeated tests, the linearity of conversion was consistently better than 0.005 percent of full scale.

This recorded linearity figure surpasses the linearity of prior art V/F converters of the same price class by as much as two orders of magnitude.

In operating the circuit herein in the F/V mode (FIG. 3) and with the same valued components as given in the V/F circuit hereinbefore, the additional components were selected with the following values:

R8 = 12k, 10 percent
C3 = 0.01 microfarads

With these values, the input range to the F/V converter is zero to 50 kHz and the output range is zero to approximately 10 volts.

Conversion linearity was also consistently better than 0.005 percent of full scale. This linearity figure also surpasses the linearity of prior art F/V converters of the same price class by as much as two orders of magnitude. In addition, the response and ripple characteristics are also superior to prior art F/V converters of the same price class.

It is contemplated within the purview of this invention that component values are not limited to those listed above as examples, but that they may be modified in the various contexts within which the integrated circuit herein operates.

As a typical example of the employment of the V/F converter and the F/V converter in a single transmitter-receiver system, there is postulated the necessity of monitoring the voltage condition of a battery in an unattended station X and measured by telemetering in a remote attended station Y. The battery circuit is connected to the input terminal 1 of the V/F module (FIG. 2) and the output frequency terminal 10 thereof is transmitted by means of any suitable electronic transmission medium equipped to relay information. At attended station Y, the information from the transmission medium is received at input terminal 6 of the F/V converter (FIG. 3) where the frequency is converted by said module back to voltage existing at output terminal 2 of the F/V converter. The voltmeter connected to output terminal 2 indicates the voltage condition of the battery at unattended station X. Both the V/F and F/V modules are connected to respective local power supplies connected to terminals 12, 13 and 14, as described heretofore, while terminal 11 is connected to ground.

The basic VFT module (FIG. 1), including the op amps of A1 and A2 and charge transfer block A3, is adaptable for selective operation either in the V/F mode when the signal is propagated in the sequence $$A2 \rightarrow A1 \rightarrow A3$$

or in the F/V mode when the signal is propagated in the sequence $$A3 \rightarrow A1 \rightarrow A2.$$

Thus, the circuit module herein can be committed to either mode by appropriate interconnections and with incorporation of the requisite external electrical components.

Although in the embodiments shown herein each of the active blocks A1, A2 and A3 are separate units within the package, it is understood that these three blocks can be built on a single monolithic chip, whereby temperature gradients across the circuit will be minimized, and improved temperature coefficient characteristics can be achieved.

In the embodiments shown herein, the output pulses from the pulse out terminal 7 are based on a negative voltage which is equal to $V_2^-$ and, therefore, the output pulses are not diode-transistor logic/transistor-transistor logic (DTL/TTL) compatible.

Similarly, the input triggering level at trigger in terminal 6 is negative, so that this input is also not DTL/TTL compatible. It should be understood, however, that both said input and said output could be "shifted" to the positive side, so that both said input and output will be DTL/TTL compatible. This can be accomplished by techniques well known to those skilled in the art. It will be noted that shifting the triggering level to positive voltage of say 2 to 3 volts will not interfere with proper operation in the V/F mode. Also, if the input triggering level is shifted to positive, then the output signal from trigger out terminal 10 must also be shifted to the positive side, so that this output will be compatible with said input.

Although the present invention has been described with reference to particular embodiments and examples, it will be apparent to those skilled in the art that variations and modifications can be substituted therefor without departing from the principles and true spirit of the invention. The "Abstract" given above is for the convenience of technical searchers and is not to be used for interpreting the scope of the invention or claims.

I claim:

1. A circuit module operative selectively in either one of two conversion modes, namely, voltage-to-frequency and frequency-to-voltage, comprising an operational amplifier (A1), a voltage follower (A2) and a charge transfer circuit (A3), means for connecting a resistor (R1) between the output of (A2) and the input of (A1), means for connecting capacitor (C1) between the input and output of (A1), means for connecting a timing circuit including a capacitor (C2) and a resistor (R7) in the (A3) circuit, means for connecting a resistor (R8) between the output of (A1) and the input of (A2), means for connecting a capacitor (C3) between the input of (A2) and ground, means for connecting a voltage reference (Vref) to (A3), and means for connecting a resistor (R2) between the output of (A3) and input of (A1), said module being operative to perform in the mode of a voltage-to-frequency converter when a signal is propagated in the sequence represented as:

voltage in $\rightarrow$ A2 $\rightarrow$ A1 $\rightarrow$ A3 $\rightarrow$ frequency out, when said module is connected to (R1), (C1), (C2), (R7), (R2) and (Vref); and to perform in the mode of a frequency-to-voltage converter when a signal is propagated in a reverse sequence represented as:

frequency in $\rightarrow$ A3 $\rightarrow$ A1 $\rightarrow$ A2 $\rightarrow$ voltage out, when said module is connected additionally to (R8) and (C3).

2. The circuit module according to claim 1 wherein, when said module operates in the voltage-to-frequency mode, the output frequency from A3 is a function of the input voltage to A2 in accordance with the formula $$f_o = \frac{R2}{K\ Vref\ R1\ R7\ C2} Vin.$$

3. The circuit module according to claim 1 wherein, when said module operates in the frequency-to-voltage mode, the output voltage from A2 is a function of the input frequency to A3 in accordance with the formula $$V_o = \frac{K\ Vref\ R1\ R7\ C2}{R2} fin.$$

4. The module according to claim 1 wherein said charge transfer device has means for extracting discrete and constant charge quotients from the capacitor (C1) of said analog integrator by triggerable strokes.

5. The module according to claim 1 wherein said charge transfer device has a triggering level.

6. The module according to claim 1 wherein the triggering signal to said charge transfer device is obtained from the output of the analog integrator in the V/F mode, and from the input frequency in the F/V mode.

7. The module according to claim 1 wherein the charge which is extracted from capacitor (C1) by the charge transfer device is a product of current and time.

8. The module according to claim 1 wherein the charge transfer device includes a mono-stable timer and a time-constant RC circuit.

9. The module according to claim 1 wherein the charge transfer device includes a timer and a transistor circuit.

* * * * *

UNITED STATES PATENT OFFICE
CERTIFICATE OF CORRECTION

PATENT NO. : 3,986,055
DATED : October 12, 1976
INVENTOR(S) : AVNER BARZELY

It is certified that error appears in the above-identified patent and that said Letters Patent are hereby corrected as shown below:

Column 3, line 49,
the formula should read:

$I_2 \times (\text{duration of } I_2)$

Column 6, after line 25,
the formula of Eq. (1) should read:

$$f_o = \frac{V_{in} \, R_2}{V_{ref} \, R_1 \, T}$$

Signed and Sealed this

Twenty-second Day of March 1977

[SEAL]

Attest:

RUTH C. MASON
*Attesting Officer*

C. MARSHALL DANN
*Commissioner of Patents and Trademarks*